United States Patent [19]
Cheng

[11] Patent Number: 5,805,031
[45] Date of Patent: Sep. 8, 1998

[54] TRANSISTOR RATIO CONTROLLED CMOS TRANSMISSION LINE EQUALIZER

[75] Inventor: Yi Cheng, San Jose, Calif.

[73] Assignee: Advanced Micro Devices, Inc., Sunnyvale, Calif.

[21] Appl. No.: 706,885

[22] Filed: Sep. 3, 1996

[51] Int. Cl.$^6$ ..................................................... H03H 7/03
[52] U.S. Cl. ........................................ 333/28 R; 375/229
[58] Field of Search ................................... 333/18, 28 R; 327/165, 167; 375/229

[56] References Cited

U.S. PATENT DOCUMENTS

| | | | |
|---|---|---|---|
| 4,204,176 | 5/1980 | Takasaki et al. | 333/28 R |
| 4,219,788 | 8/1980 | Cordell | 333/28 R |
| 4,459,554 | 7/1984 | Mattisson | 333/28 R X |

Primary Examiner—Paul Gensler
Attorney, Agent, or Firm—Davis Chin

[57] ABSTRACT

A CMOS transmission line equalizer is provided for receiving distorted signals transmitted through a transmission line and for compensating for the signal distortion. The equalizer has a transfer function characteristic with a single pole and a single zero. The transfer function includes a mirroring ratio circuit (CMR) for controlling the ratio between the single pole and the single zero. The mirroring ratio circuit is controlled by transistor size ratio. The single zero serves to cancel the dominant pole in the transfer function of the transmission line so as to compensate for the signal distortion caused by the transmission line.

20 Claims, 4 Drawing Sheets

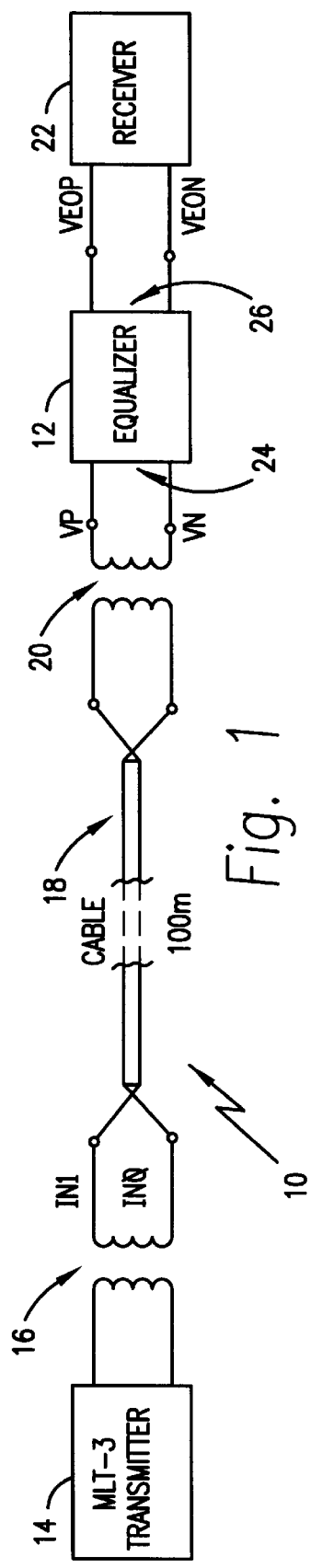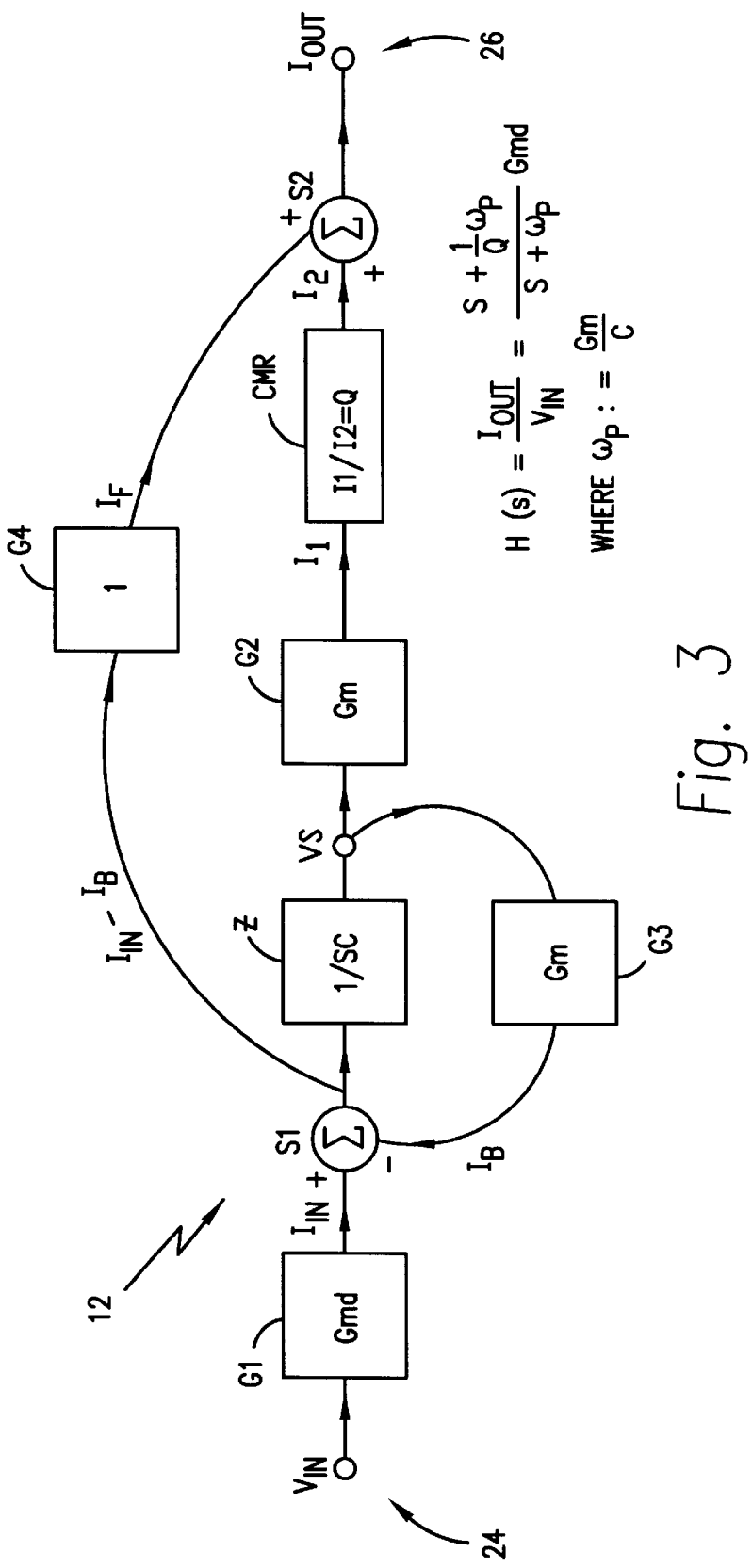
Fig. 1
Fig. 3

TRANSISTOR RATIO CONTROLLED CMOS TRANSMISSION LINE EQUALIZER

BACKGROUND OF THE INVENTION

1. Field of the Invention

This invention relates generally to integrated circuit technology used in data communication systems. More particularly, it relates to a CMOS transmission line equalizer for compensating for signal distortion caused by the transmission line.

2. Description of the Prior Art

As is generally known in the art of data communication systems, when a transmitter sends analog/digital signals over a transmission medium such as a transmission line to a receiver the received analog/digital signals may become distorted due to the signals being transmitted through a certain length of the transmission line. For example, a 100BaseT Ethernet receiver (following the Ethernet standard ANSI/IEEE Std. 802.3u) must be able to receive a three-level analog signal at the rate of 125 megabits per second, after such signal has been passed through a transmission line having a length up to 100 meters. In order to compensate for the signal distortion due to the signals being transmitted through the transmission line, there is typically required some type of "equalizer circuit" to which the received signals are applied before they are passed on to the receiver.

One type of an equalizer circuit is an active RC filter which is a first generation filter implemented as an integrated circuit. In this design, the active filter is essentially comprised of three basic components of operational amplifiers having a very high gain-bandwidth, resistors, and capacitors. While the design of different RC filters are fairly straightforward in principle, they suffer from the disadvantage that an operational amplifier with sufficient high gain over a wide range of frequency in CMOS technology is often difficult to obtain in practice. Thus, the use of an operational amplifier with insufficient gain-bandwidth may cause distortion of the signals at the output of the filter. Further, it is not always possible to provide the resistors and capacitors with the necessary precise values in CMOS technology without the added cost of a trimming process.

It was also known that in CMOS technology it is quite difficult to fabricate the resistors and the capacitors to possess an absolute value. However, the geometrical sizes of different devices can be matched to a high degree of accuracy. Based upon this realization, there has been developed a second type of filter referred to as a switched capacitor filter so as to integrate the filter onto silicon. While the performance of this method does not depend upon the precise values of the capacitors but upon the capacitance value ratio, there is still required the use of an operational amplifier and thus suffers from the same problems that existed in the RC filter.

In a third type of filter referred to as a transconductance-C filter, this technique utilizes the MOS transistor characteristics of being in essence a voltage controlled current source and whose transconductance is obtained from the MOS process. Since this latter design does not use operational amplifiers but rather being based on the transconductance and capacitance of the transistor, it has the advantage of being able to provide a high gain-bandwidth filter. Nevertheless, this technique is not without problems. Since the transconductance of the transistor device is not stable over the silicon wafer process corners and is temperature dependent, additional circuitry are generally required so as to correct for any variations thereof causing increased filter design cost.

It would therefore be desirable to provide an improved CMOS transmission line equalizer for compensating for signal distortions which has improved performance and overcomes the deficiencies of the prior art. It would also be expedient to provide an equalizer whose characteristics are controlled by the transistor size ratios in order to render a stable operation over silicon wafer process corners and variations in temperatures.

SUMMARY OF THE INVENTION

Accordingly, it is a general object of the present invention to provide a CMOS transmission line equalizer for compensating for signal distortion caused by a transmission line, but yet overcomes the disadvantages of the prior art.

It is an object of the present invention to provide a CMOS transmission line equalizer which has a high speed of operation compatible with CMOS technology.

It is another object of the present invention to provide a CMOS transmission line equalizer which is formed of a relatively small circuit size on silicon.

It is still another object of the present invention to provide a CMOS transmission line equalizer whose characteristics are controlled by the transistor size ratios in order to render a stable operation over process corners and variations in temperatures.

In accordance with the preferred embodiment of the present invention, there is provided a CMOS transmission line equalizer for receiving distorted signals transmitted through a transmission line and for compensating for the signal distortion. The equalizer includes an input terminal for receiving the distorted signals transmitted through the transmission line. The transmission line has a dominant zero in its transfer function. A transfer function circuit is provided to generate a single pole and a single zero. The transfer function circuit includes a mirroring ratio circuit for controlling the ratio between the single pole and the single zero. The mirroring ratio circuit is controlled by transistor size ratios. The single zero serves to cancel the dominant pole in the transfer function of the transmission line so as to compensate for the signal distortion caused by the transmission line. An output terminal is provided for generating restored signals which have been restored by the equalizer.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a simplified block diagram of a data communication system employing the CMOS transmission line equalizer 12, constructed in accordance with the principles of the present invention;

FIG. 3 is a block diagram of the equalizer of FIG. 1;

DESCRIPTION OF THE PREFERRED EMBODIMENT

Figure 2A:
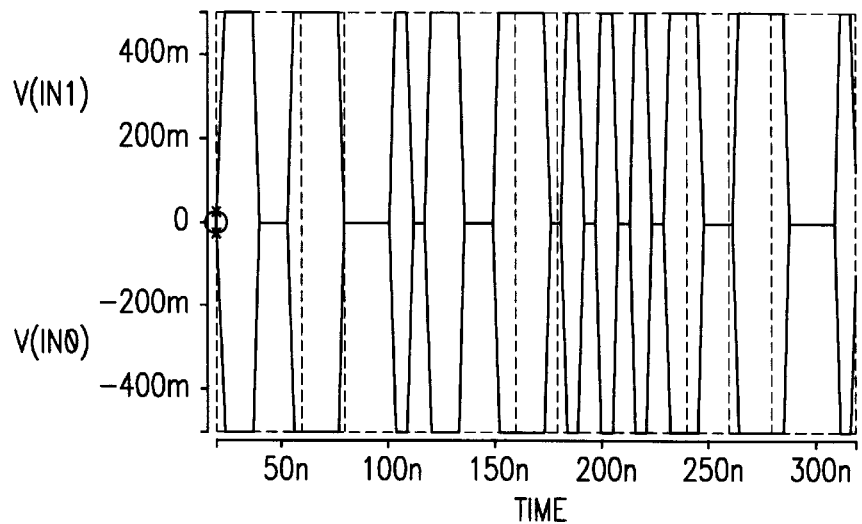
FIGS. 2(a) through 2(f) are waveforms at various points in FIG. 1, useful in explaining the operation of the present invention.

Referring now in detail to the drawings, there is illustrated in FIG. 1 a simplified block diagram of a data communication system 10 utilizing a CMOS transmission line equalizer 12 which is constructed in accordance with the principles of the present invention. The data communication system 10 is comprised of a MLT-3 transmitter 14, a coupling transformer 16, a transmission medium 18, a decoupling transformer 20, the equalizer 12 of the present invention, and an Ethernet receiver 22. The transmission medium 18 is preferably a transmission line or cable having a length up to 100 meters. Since the transmission line has a limited bandwidth, the signals being transmitted therethrough will have amplitude loss and phase shift, the amounts being dependent upon the signal frequency. The higher frequency signals will have more loss in amplitude and more phase shift, which will cause signal distortion.

The transmission line equalizer 12 is designed to enhance the high frequency components in a signal, after it has been transmitted through the transmission line, so as to compensate (equalize) the transmission line distortion. Accordingly, the equalizer receives the distorted signals from the transmission line 18 on its input 24 and provides on its output 26 restored signals which approximates as closely as possible the original signals being transmitted from the transmitter 14. Thereafter, the restored signals are delivered to the receiver 22.

The frequency response (transfer function) of the length of transmission lines can be measured and has been found to approximate a low pass filter having a single dominant pole. In view of this, in order to compensate for the transmission line distortion it is required to design an equalizer with a frequency response which has a dominant zero in its transfer function so as to cancel the dominant pole in the transmission line transfer function. As a result, the signal distortion caused by the limited bandwidth of the transmission line can be eliminated.

In FIG. 3, there is shown a block diagram (also called a signal flow graph) of the CMOS transmission line equalizer 12 of FIG. 1, according to the present invention. The equalizer 12 has thus been designed to compensate for the signal distortion of the transmission line 16. The equalizer 12 is comprised of a first transconductance block G1, a first summer block S1, a transimpedance block Z, a second transconductance block G2, a current mirroring ratio block CMR, a second summer block S2, a third transconductance block G3, and a unity gain current amplifier block G4.

As can be seen, the first transconductance block G1 has a value of Gmd and receives a fully differential input signal $V_{in}$ and generates a current signal $I_{in}$. The first summer S1 receives the current signal $I_{in}$ on its plus (+) input terminal and a feedback current signal $I_B$ on its minus (−) terminal from the third transconductance block G3, which has a value of Gm. Thus, the output of the first summer S1 produces the signal $I_{in} - I_B$ which is fed to the transimpedance block Z. The transimpedance block has a value of 1/SC and generates an output voltage signal $V_S$.

The voltage signal $V_S$ is fed back to the input of the third transconductance block G3. The second transconductance block G2 has a value also of Gm and receives the voltage signal $V_S$ on its input and generates a current signal $I_1$. The current mirroring ratio block CMR has a value of $I_1/I_2=Q$ and receives on its input the current signal $I_1$ and generates on its output a current signal $I_2$. The second summer S2 receives directly the current signal $I_2$ on its first plus input terminal and also receives on its second plus input terminal the signal $I_{in} - I_B$ from the first summer S1 after it has been passed through the amplifier block G4 with a gain of 1. The output of the second summer block S2 produces a current signal $I_{OUT}$, which is also defined as the output of the equalizer 12.

The overall transfer function of the equalizer 12 in FIG. 3 is defined as H(S) and will now be derived to show that it does indeed possess one real pole (equal to the value Gm/C) and one real zero (equal to the value Gm/C(1/Q)). The quality factor Q is defined by the current mirroring ratio between the current signals $I_1$ and $I_2$ and determines the ratio between the pole and the zero.

Initially, it will be noted that the voltage signal $V_S$ can be expressed mathematically as follows:

$$V_S = (I_{in} - I_B) \cdot \frac{1}{SC} \tag{1}$$

By substituting for the currents $I_{in}$ and $I_B$ into equation (1), there is given:

$$V_S = (V_{in} \cdot Gmd - V_S \cdot Gm) \cdot \frac{1}{SC} \tag{2}$$

By solving equation (2) for the voltage signal $V_S$, we have:

$$V_S = \frac{V_{in} \cdot Gmd \cdot \frac{1}{SC}}{1 + \frac{Gm}{SC}} \tag{3}$$

By rearranging equation (3), there is given:

$$V_S = \frac{Gmd \cdot \frac{1}{C}}{S + \frac{Gm}{C}} \cdot V_{in} \tag{4}$$

If we let Gm/C be equal to the pole $\omega_p$, then we have:

$$V_S = \frac{Gmd \cdot \frac{1}{C}}{S + \omega_p} \cdot V_{in} \tag{5}$$

Referring to the output of the second summer S2, the output current $I_{OUT}$ can be stated as follows:

$$I_{OUT} = I_2 + I_F \tag{6}$$

where $I_F$ is the output current of the block G4.

By substituting for the current $I_2$ and $I_F$ into equation (6), there is obtained:

$$I_{OUT} = \frac{I_1}{Q} + I_{in} - I_B \tag{7}$$

Further, by substituting for the currents $I_1$, $I_{in}$ and $I_B$ into equation (7), we have:

$$I_{OUT} = \frac{V_S \cdot Gm}{Q} + V_{in} \cdot Gmd - V_S \cdot Gm \tag{8}$$

By rearranging and factoring out $V_S \cdot Gm$, we have:

$$I_{OUT} = V_S \cdot Gm \left( \frac{1}{Q} - 1 \right) + V_{in} \cdot Gmd \tag{9}$$

From substitution of the voltage signal $V_S$ from above equation (5) into the above equation (9), there is obtained:

$$I_{OUT} = \frac{\frac{1}{C} \cdot Gmd \cdot V_{in}}{S + \omega_p} \cdot Gm \left( \frac{1}{Q} - 1 \right) + V_{in} \cdot Gmd \tag{10}$$

By simplifying and solving equation (10) for $I_{OUT}/V_{in}$, we have:

$$\frac{I_{OUT}}{V_{in}} = \frac{\frac{Gm}{C}\left(\frac{1}{Q}-1\right)+S+\omega_p}{S+\omega_p} \cdot Gmd \quad (11)$$

By again substituting $\omega_p$ for Gm/C and simplifying, there is obtained the overall transfer function H(S) of FIG. 2 as follows:

$$H(S) = \frac{I_{OUT}}{V_{in}} = \frac{S+\frac{\omega_p}{Q}}{S+\omega_p} \cdot Gmd \quad (12)$$

As can be seen from above equation (12), the transfer function of the equalizer 12 has one real pole at the value of Gm/C and has one real zero at the value of (Gm/C)/Q. Thus, the equalizer 12 can be realized by utilizing the transconductance characteristics and gate capacitance of CMOS transistors in order to implement the pole and zero of the transfer function. Further, it will be noted that the relationship of the zero to the pole in the transfer function is controlled by the quality factor Q. The value of Q is not dependent upon precision values of circuit components, but is a function of the current mirroring ratio between the currents $I_1$ and $I_2$. As previously pointed out, in CMOS technology, while it is not possible to control the absolute value for circuit elements, it is easy to match geometrical sizes of devices. Accordingly, the equalizer 12 of the present invention can be made to be very stable over process corners and variations in temperatures since the current value ratio (Q) can be precisely controlled. As a result, if the current is mirrored at a stable ratio, the ratio between the pole and the zero will also be stable.

Figure 4:
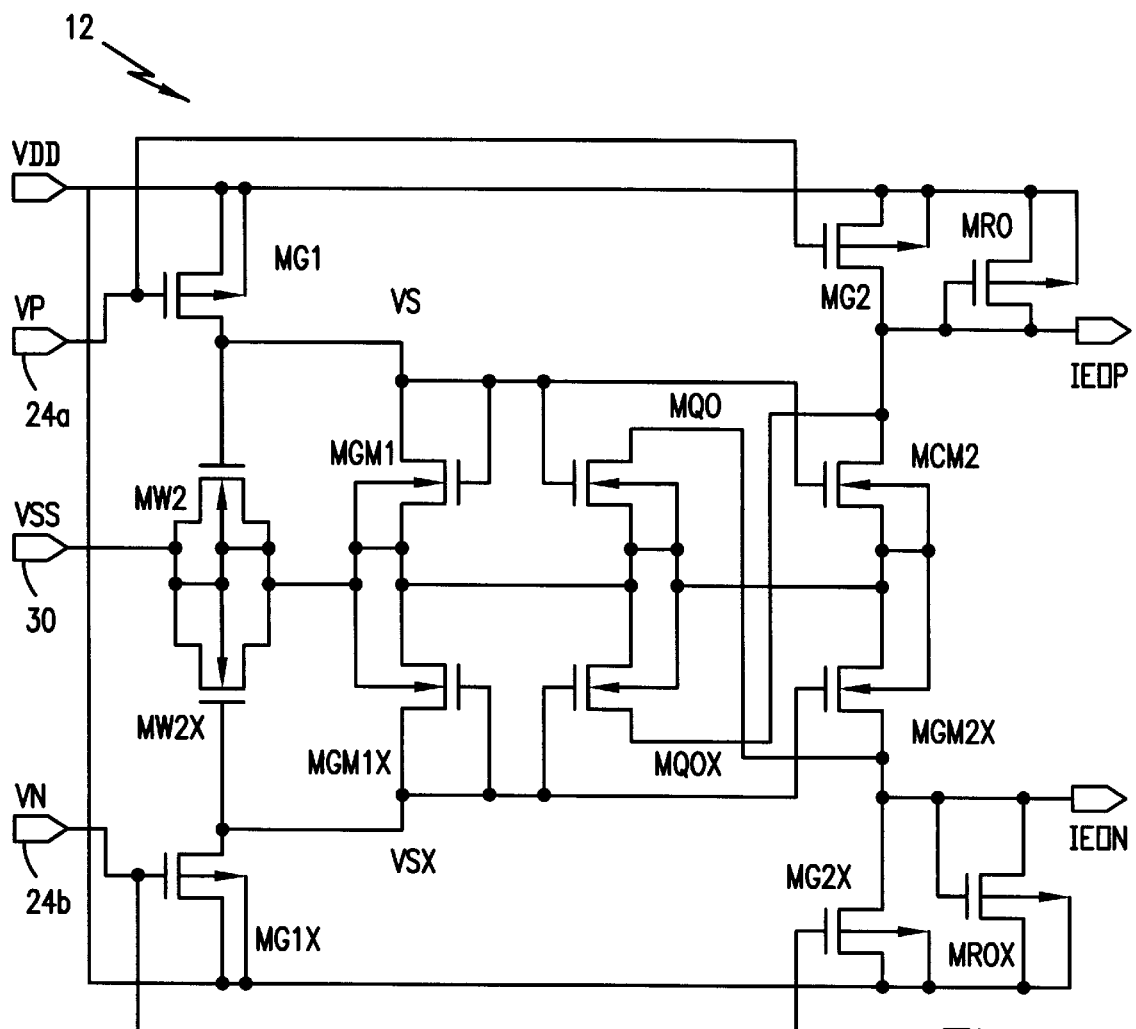
FIG. 4 is a detailed schematic circuit diagram of a CMOS transmission line equalizer, illustrating an implementation of FIG. 3.

In FIG. 4, there is shown a detailed schematic circuit diagram of a CMOS transmission line equalizer 12 which is a practical implementation of FIG. 3. The transfer function characteristic of the equalizer 12 is controlled by the ratio of transistor sizes of different devices. The P-channel MOS transistors MG1 and MG2 are connected in a current mirroring arrangement and correspond to the first transconductance block G1. While the block diagram of FIG. 3 is shown for a single-ended operation, the circuit of FIG. 4 is shown for a fully differential operation which reduces noise. Thus, there are also provided P-channel MOS transistors MG1X and MG2X for the other corresponding half. The gates of the transistors MG1 and MG2 receive the input voltage signal $V_P$ on terminal 24a, and the gates of the transistors MG1X and MG2X receive input voltage signal $V_N$ on terminal 24b. The current in the drain of the transistor MG1 represents the current $I_{in}$ in FIG. 3. The source and substrate of the transistor MG1 are connected to a positive supply voltage VDD, which is typically +5.0 volts or lower.

The N-channel MOS transistors MW2 and MW2X are connected to function as MOS capacitors and correspond to the transimpedance block Z. The gate of the transistors MW2, MW2X serves as one plate of the capacitor, and the drain and source thereof are connected together and serve as the other plate of the capacitor. The N-channel MOS transistors MGM1 and MGM2 correspond to the value of Gm in the transconductance blocks G3 and G2, respectively. Likewise, there are also provided the N-channel MOS transistors MGM1X and MGM2X for the other corresponding half. The gate of the transistor MGM1 receives the voltage signal $V_S$. The current in the drain of the transistor MGM1 represents $I_B$ in FIG. 3. The source of the transistor MGM1 is connected to a terminal 30, which is typically at ground potential VSS.

The N-channel MOS transistors MQ0 and MQ0X function as the current mirroring ratio block CMR of FIG. 3. By controlling the sizes of the transistors MQ0 and MQ0X, the mirroring ratio Q between the currents $I_1$ and $I_2$ can be selected so as to determine the ratio between the pole and the zero. The gate of the transistor MQ0 is connected to the voltage signal $V_S$. The source thereof is connected to the ground potential, and the drain thereof is tied to the drain of the transistor MGM2X. Similarly, the drain of the transistor MQ0X is tied to the drain of the transistor MGM2. The transistors MR0 and MRX function as resistors so as to convert the output current $I_{OUT}$ to a voltage $V_{OUT}$.

In the Table listed below, there is illustrated typical width to length (W/L) ratios for the transistors in the circuit of FIG. 4. Further, the number M is the number of the transistors having the particular W/L ratio that are connected together in parallel:

TABLE

| TRANSISTOR | W/L RATIO | M |
|---|---|---|
| MG1/MG1X | 64:2 | 3 |
| MG2/MG2X | 64:2 | 3 |
| MW2/MW2X | 50:50 | |
| MGM1/MGM1X | 32:2 | 3 |
| MGM2/MGM2X | 32:2 | 3 |
| MQ0/MQ0X | 4.8:2 | M1 |

As can be seen, the mirroring ratio Q between the currents $I_1$ and $I_2$ is equal to the ratio of the transistor sizes of the transistors MGM1 to MQ0 or 32/2×3 divided by 4.8/2×M1. Thus, the quality factor Q is equal to 96/4.8×M1 or 20/M1. Accordingly, by selecting the number M1, which is the number of transistors MQ0, the value of Q can be controlled.

Figure 5:
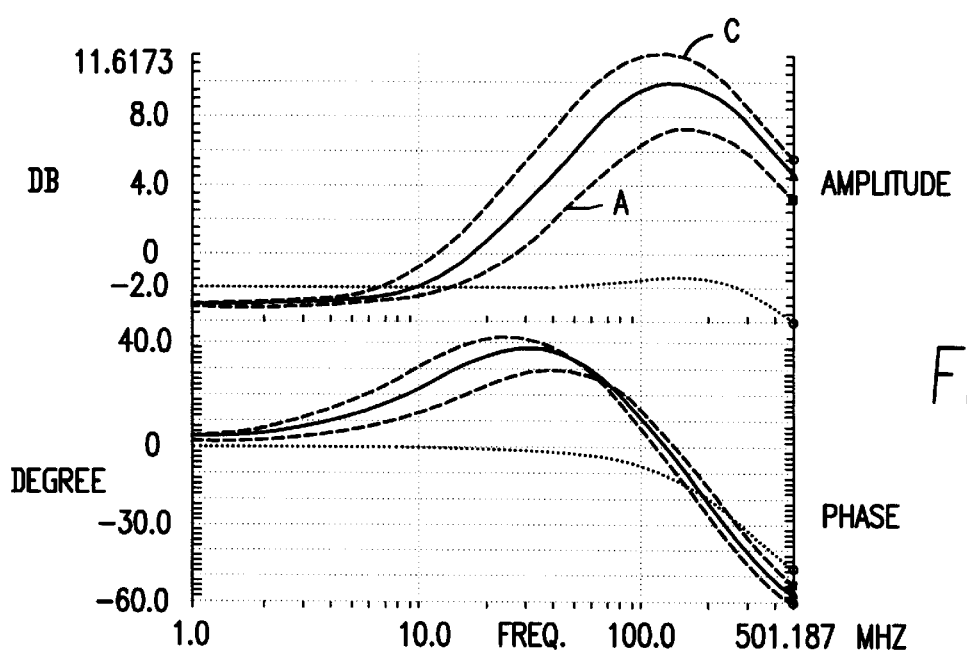
FIG. 5 is a spice simulation, showing the transfer function of FIG. 3 for various values of the quality factor Q.

In FIG. 5, there is shown a spice simulation of the circuit of FIG. 4 for different values of Q. The lower curve A has a low Q. The curve C has a high value of Q. These curves illustrate that the high frequency components in a signal transmitted through the equalizer of FIG. 4 will be enhanced.

Figure 2C:
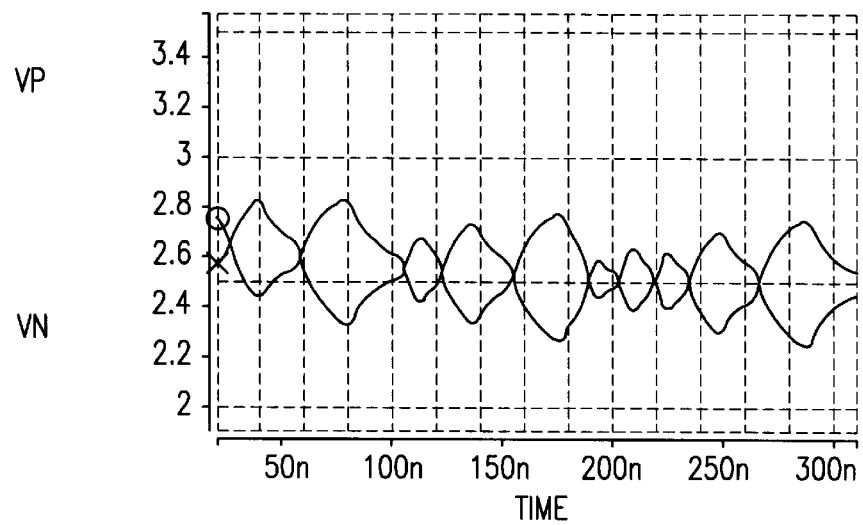
Figure 2E:
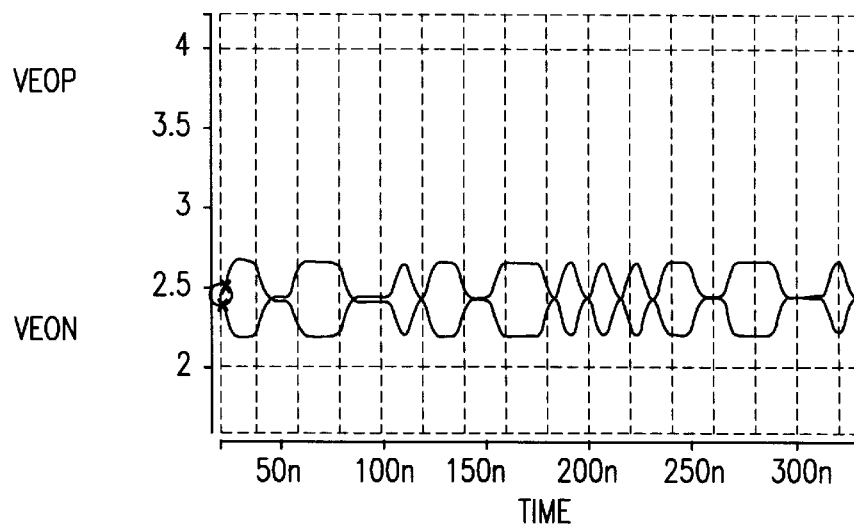
Figure 2B:
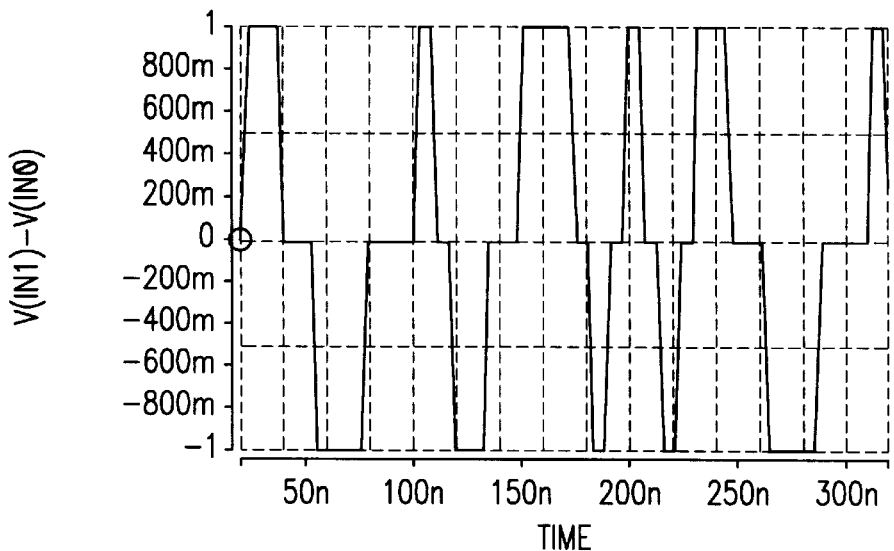
Figure 2D:
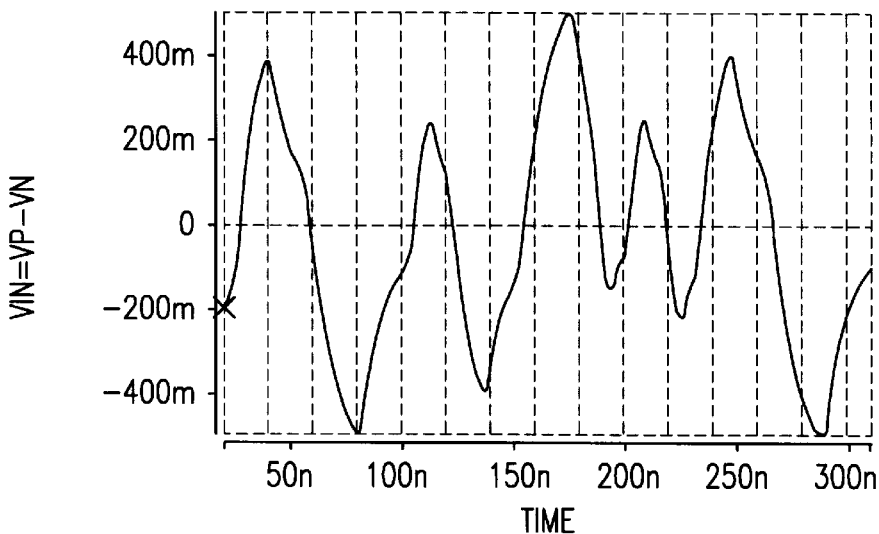
Figure 2F:
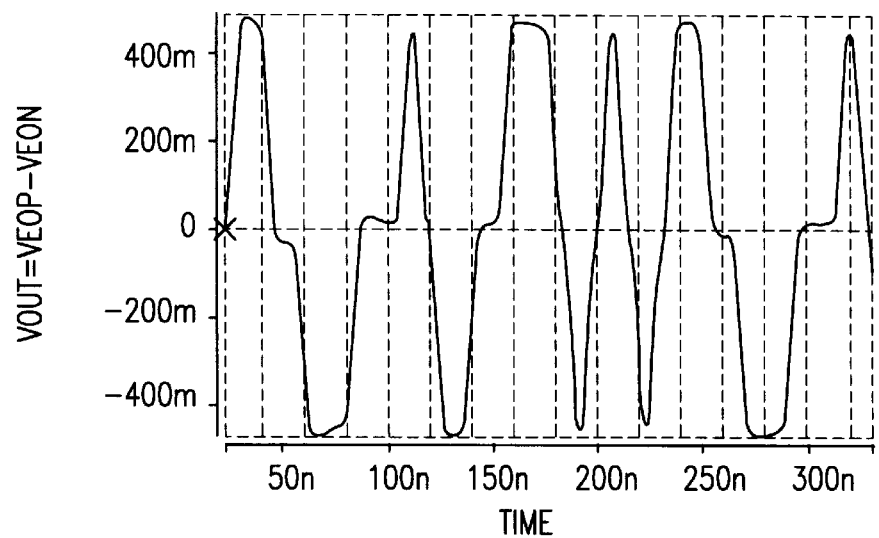

With reference to FIG. 1 again, the operation of the equalizer 12 can be observed from the waveforms of FIGS. 2(a) through 2(f). FIG. 2(a) shows the respective single ended input voltage signal $V_{IN1}$ and $V_{IN0}$ applied to the input of the transmission line 18. FIG. 2(b) illustrates the differential input voltage signal $V_{IN1}-V_{IN0}$ applied across the input of the transmission line 18. FIG. 2(c) depicts the respective single-ended distorted signal $V_P$ and $V_N$ (after being transmitted through 100 meters of the transmission line 18). The fully differential voltage signal $V_{in}=(V_P-V_N)$ applied across the input terminal 24a, 24b of the equalizer 12 is illustrated in FIG. 2(d). The single-ended restored signals $V_{EOP}$ and $V_{EON}$ (after being passed through the equalizer) are shown in FIG. 2(e). Finally, the restored differential output voltage $V_{OUT}=(V_{EOP}-V_{EON})$ from the output of the equalizer is illustrated in FIG. 2(f). As will be noted, the restored signal $V_{OUT}$ of FIG. 2(f) resembles closely the differential input signal $V_{IN1}-V_{IN0}$ of FIG. 2(b).

The CMOS transmission line equalizer of the present invention has the following advantages over the conventional prior art equalizers:

(a) it has a more stable operation since the quality factor Q is controlled by a current mirror ratio (transistor size ratio) which is not varied over process corners and temperature changes;

(b) it can be implemented as a relatively small circuit on silicon integrated circuits;

(c) it has a high speed of performance due to its current mode of operation; and (d) it uses the transconductance and gate capacitance of transistors to realize the transfer function pole/zero so as to eliminate the need for additional tuning circuity in its design.

From the foregoing detailed description, it can thus be seen that the present invention provides an improved CMOS transmission line equalizer for receiving distorted signals transmitted through a transmission line and for compensating for the signal distortion. The equalizer of the present invention has a characteristic which is controlled by the transistor size ratio in order to render a stable operation over process corners and variations in temperatures. The equalizer has a transfer function with a single zero for cancelling the dominant pole in the transfer function of the transmission line so as to compensate for the signal distortion caused by the transmission line.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

I claim:

1. A CMOS transmission line equalizer for receiving distorted signals transmitted through a transmission line and for compensating for the signal distortion, said equalizer comprising:

input means (24) for receiving the distorted signals transmitted through the transmission line, said transmission line having a transfer function with a dominant pole;

transfer function means (H(S)) for generating a single pole and a single zero;

said transfer function means including current mirroring ratio means (CMR) for controlling ratio between said single pole and said single zero, said current mirroring ratio means being formed of a plurality of transistors and being controlled by transistor size ratio;

said single zero cancelling the dominant pole in the transfer function of said transmission line so as to compensate for the signal distortion caused by said transmission line; and output means (26) for generating restored signals which have been restored by said equalizer.

2. A CMOS transmission line equalizer as claimed in claim 1, wherein said transfer function means is comprised of a transfer function equal to $$\frac{S+\frac{Gm}{C}\left(\frac{1}{Q}\right)}{S+\frac{Gm}{C}} \cdot Gmd,$$

said single pole being defined by Gm/C, said single zero being defined by Gm/C Q, and said mirroring ratio being defined by Q.

3. A CMOS transmission line equalizer as claimed in claim 1, wherein a first transistor (MG1) is used to form a first transconductance (Gmd).

4. A CMOS transmission line equalizer as claimed in claim 1, wherein a second transistor (MW2) is used to form the capacitance (C).

5. A CMOS transmission line equalizer as claimed in claim 1, wherein third and fourth transistors (MGM1, MGM2) are used to form transconductances (Gm).

6. A CMOS transmission line equalizer as claimed in claim 1, wherein a fifth transistor (MQ0) is used to form the mirroring ratio (Q).

7. A communication system comprising in combination:

transmitter means (14) for generating original signals;

transmission medium means (18) for causing distortion in said original signals as they are transmitted therethrough;

equalizer means (12) for receiving distorted signals transmitted through said transmission medium means and for compensating for the signal distortion;

receiver means (22) for receiving restored signals from said equalizer means; and said equalizer means including, input means (24) for receiving the distorted signals transmitted through the transmission line, said transmission line having a transfer function with a dominant pole, transfer function means (H(S)) for generating a single pole and a single zero, said transfer function means including current mirroring ratio means (CMR) for controlling ratio between said single pole and said single zero, said current mirroring ratio means being formed of a plurality of transistors and being controlled by transistor size ratio, said single zero cancelling the dominant pole in the transfer function of said transmission line so as to compensate for the signal distortion caused by said transmission line, and output means (26) for generating restored signals which have been restored by said equalizer.

8. A communication system as claimed in claim 7, wherein said transfer function means is comprised of a transfer function equal to $$\frac{S+\frac{Gm}{C}\left(\frac{1}{Q}\right)}{S+\frac{Gm}{C}} \cdot Gmd,$$

said single pole being defined by Gm/C, said single zero being defined by Gm/C Q, and said mirroring ratio being defined by Q.

9. A communication system as claimed in claim 7, wherein a first transistor (MG1) is used to form a first transconductance (Gmd).

10. A communication system as claimed in claim 7, wherein a second transistor (MW2) is used to form the capacitance (C).

11. A communication system as claimed in claim 7, wherein third and fourth transistors (MGM1, MGM2) are used to form transconductances (Gm).

12. A communication system as claimed in claim 7, wherein a fifth transistor (MQ0) is used to form the mirroring ratio (Q).

13. A CMOS transmission line equalizer for a communication system comprising:

first transconductance means (G1) responsive to distorted signals transmitted through a transmission line for generating a first signal;

first summer means (S1) responsive to said first signal and a second signal for generating a third signal;

capacitance means (Z) responsive to said third signal for generating a fourth signal;

second transconductance means (G2) responsive to said fourth signal for generating a fifth signal;

third transconductance means (G3) also responsive to said fourth signal for generating said second signal;

current mirroring ratio means (CMR) responsive to said fifth signal for generating a sixth signal;

unity gain amplifier means (G4) also responsive to said third signal for generating a seventh signal; and second summer means (S2) responsive to said sixth and seventh signals for generating restored signals.

14. A CMOS transmission line equalizer as claimed in claim 13, wherein said first transconductance means (G1) is formed of a pair of P-channel MOS transistors (MG1, MG2) arranged in a current mirror configuration.

15. A CMOS transmission line equalizer as claimed in claim 14, wherein said capacitance means (Z) is formed by an N-channel transistor (MW2).

16. A CMOS transmission line equalizer as claimed in claim 15, wherein said second transconductance means (G2) is formed by an N-channel transistor (MGM1).

17. A CMOS transmission line equalizer as claimed in claim 16, wherein said third transconductance means (G3) is formed by an N-channel transistor (MGM2).

18. A CMOS transmission line equalizer as claimed in claim 17, wherein said current mirroring ratio means (CMR) is formed by an N-channel transistor (MQ0).

19. A CMOS transmission line equalizer as claimed in claim 13, wherein said current mirroring ratio means includes a plurality of transistors and wherein said equalizer has a transfer function characteristic which is controlled by transistor size ratios.

20. A CMOS transmission line equalizer as claimed in claim 19, wherein said transfer function characteristics has a single zero and a single pole, said single zero cancelling the dominant pole in the transfer function of said transmission line so as to compensate for the signal distortion caused by said transmission line.

* * * * *